(12) United States Patent
Ohbayashi

(10) Patent No.: US 6,597,041 B2
(45) Date of Patent: Jul. 22, 2003

(54) SEMICONDUCTOR STATIC RANDOM ACCESS MEMORY DEVICE

(75) Inventor: Shigeki Ohbayashi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/906,146

(22) Filed: Jul. 17, 2001

(65) Prior Publication Data

US 2002/0093111 A1 Jul. 18, 2002

(30) Foreign Application Priority Data

Jan. 16, 2001 (JP) .................................... 2001-007491

(51) Int. Cl.[7] ............................................. H01L 27/11
(52) U.S. Cl. ........................................ 257/369; 257/903
(58) Field of Search ................................ 257/369, 903

(56) References Cited

U.S. PATENT DOCUMENTS

| | | | |
|---|---|---|---|
| 5,541,427 A | 7/1996 | Chappell et al. | 257/306 |
| 5,744,844 A * | 4/1998 | Higuchi | 257/903 |
| 5,886,388 A * | 3/1999 | Wada et al. | 257/903 |
| 5,930,163 A * | 7/1999 | Hara et al. | 257/903 |

FOREIGN PATENT DOCUMENTS

JP 57-12486 1/1982

OTHER PUBLICATIONS

"Process Technique of an including DRAMS", Trend of TECHNOLOGY, Sep. 1999, pp. 4–7. (No translation).

* cited by examiner

Primary Examiner—Gene M. Munson
(74) Attorney, Agent, or Firm—McDermott, Will & Emery

(57) ABSTRACT

A memory cell of an SRAM has a full CMOS cell structure having successively aligned three wells of different conductivity types, and includes first and second contact holes extending from positions on first and second gates to positions above an impurity region of a predetermined MOS transistor, and formed in a self-aligned fashion with respect to the first and second gates, and first and second local interconnections formed in the contact holes, respectively.

9 Claims, 21 Drawing Sheets

SEMICONDUCTOR STATIC RANDOM ACCESS MEMORY DEVICE

BACKGROUND OF THE INVENTION

1. Field of the Invention

The present invention relates to an SRAM (Static Random Access Memory) provided with memory cells, each of which includes six MOS (Metal Oxide Silicon) transistors, and will be referred to as a "full CMOS cell" hereinafter, as well as a method of manufacturing the same. More particularly, the invention relates to a structure of a memory cell of an SRAM, which can reduce an area of the memory cell.

2. Description of the Background Art

In accordance with lowering of voltages used in SRAMs, SRAMs provided with memory cells of a high resistance load type or a TFT load type, each of which has four MOS transistors and two loads, were in the mainstream when the lowered voltage was 3 volts or higher.

In recent years, however, the voltage has been further lowered to 2.5 V, 1.8 V or 1.5 V. In accordance with this, the SRAMs of the high resistance load type or TFT load type, which were in the mainstream, have declined due to inferior operation characteristics, and the SRAMs provided with the full CMOS cells each having six MOS transistors are becoming mainstream.

The full CMOS cell is generally a memory cell formed of two bulk access nMOS transistors, two bulk driver nMOS transistors and two bulk load pMOS transistors.

An example of a layout of a conventional full CMOS cell is described in Japanese Patent Laying-Open No. 10-178110. The layout described in this publication is shown in FIG. 26.

As shown in FIG. 26, a full CMOS cell in the prior art has p- and n-wells arranged alternatively in the lateral direction. On the p-wells, nMOS transistors 50a–50d are formed. Also, pMOS transistors 51a and 51b are formed on the n-well. Further, polycrystalline silicon layers 52–55, which form gates of these transistors, are formed.

As shown in FIG. 26, many contact holes 56a–56i and via holes 57a–57i are formed for connecting the gates and impurity regions of the respective MOS transistors to the upper level interconnections.

In the example shown in FIG. 26, contact holes 56b and 56f are arranged above inverter gates, and contact holes 56e and 56g independent of contact holes 56b and 56f are arranged between the inverter gates. Therefore, it is necessary to ensure spaces D1 and D2 between contact hole 56e and the inverter gates, and it is also necessary to ensure spaces D3 and D4 between contact hole 56g and inverter gates. Therefore, large spaces are required between the inverter gates, resulting in increase in memory cell area.

SUMMARY OF THE INVENTION

The invention has been developed for overcoming the above problems, and an object of the invention to reduce an area of a full CMOS cell.

A semiconductor memory device according to the invention includes memory cells each including first and second access MOS transistors, first and second driver MOS transistors and first and second load MOS transistors, a first well region of a first conductivity type for forming the first driver MOS transistor and the first access MOS transistor thereon, a second well region of the first conductivity type for forming the second driver MOS transistor and the second access MOS transistor thereon, a third well region of a second conductivity type formed between the first and second well regions for forming the first and second load MOS transistors thereon, a first gate forming gates of the first driver MOS transistor and the first load MOS transistor, a second gate for forming gates of the second driver MOS transistor and the second load MOS transistor, a first contact hole formed in a self-aligned fashion with respect to the first and second gates, and reaching one of impurity regions of the first driver MOS transistor, one of impurity regions of the first load MOS transistor and the second gate, a first local interconnection formed in the first contact hole, and electrically connected to the first driver MOS transistor, the first load MOS transistor and the second gate, a second contact hole formed in a self-aligned fashion with respect to the first and second gates, and reaching one of impurity regions of the second driver MOS transistor, one of impurity regions of the second load MOS transistor and the first gate, and a second local interconnection formed in the second contact hole, and electrically connecting the second driver MOS transistor, the second load MOS transistor and the first gate.

As described above, each of the first and second contact holes extends from the first or second gate to the predetermined impurity region. Therefore, it is not necessary to employ a conventional structure shown in FIG. 26, in which independent contact holes 56b, 56d, 56g and 56f spaced from each other are formed in the positions on the first and second gates as well as in the positions between the first and second gates. Therefore, spaces D1 and D4 in FIG. 26 can be reduced, and the space between the first and second gates can be smaller than that in the prior art. Further, spaces D2 and D3 in FIG. 26 can be reduced because the first and second contact holes are formed in the self-aligned fashion with respect to the first and second gates. This also contributes to reduction in space between the first and second gates.

Preferably, the first and second contact holes have the same form. Thereby, the form and size of the local interconnections can be uniform so that transfer and etching for forming the local interconnections can be performed easily.

Preferably, the semiconductor memory device according to the invention includes a first interlayer insulating layer covering the first and second gates, a second interlayer insulating layer formed on the first interlayer insulating layer, a first metal interconnection formed on the second interlayer insulating layer, and extending in a direction of alignment of the first, second and third well regions for forming a word line, and a plurality of second metal interconnections formed on the first metal interconnection with a third interlayer insulating layer therebetween for forming a bit line (BIT line), a ground line (GND line) and a power supply line $V_{DD}$ line. Thereby, the first and second metal interconnections can be formed to satisfy characteristics required therein. Since the memory cell is long in the extending direction of the word line, the space between the second metal interconnections can be increased by arranging the second metal interconnections in this extending direction. Thereby, the second metal interconnection can be formed easily.

Preferably, the semiconductor memory device according to the invention includes a plurality of third contact holes for electrically connecting the second metal interconnections to the predetermined MOS transistors, the first and second contact holes are formed in the first interlayer insulating layer, and the third contact holes extend through the first and second interlayer insulating layers, and are formed in a self-aligned fashion with respect to the first or second gate.

Thereby, the first and second contact holes can be formed in a step different from that of forming the third contact holes, which are different in form from the first and second contact holes, so that the first, second and third contact holes can be formed easily. The space between the third contact hole and each of the first and second contact holes can be smaller than that in the case of simultaneously forming these contact holes.

Preferably, the first metal interconnection has a smaller thickness than the second metal interconnection.

The space between the first metal interconnections is narrow in many cases. Therefore, the smaller thickness of the first metal interconnection allows easy formation of the first metal interconnection. This improves the yield of manufacturing.

The first and second metal interconnections may be made of different materials, respectively. The material of the first metal interconnection may have a higher resistivity than the material of the second metal interconnection. More specifically, the first metal interconnection may be made of a material such as tungsten, which has a relatively high resistivity, but is suitable as a material filling the contact hole, and the second metal interconnection may be made of a material such as aluminum or aluminum alloy, which has a lower resistivity than the tungsten.

Thereby, the first metal interconnection formed of tungsten or the like can be extended from a position within the contact hole to a position on the interlayer insulating layer, and it is not necessary to employ a step of filling the contact hole with a conductive layer to form a plug as well as a step of forming an interconnection of aluminum or aluminum alloy on the plug. Therefore, the first metal interconnection can be formed through simplified steps.

The first metal interconnection may be made of the same material as a conductive layer filling the third contact hole. In this case, the first metal interconnection extending integrally from the position within the third contact hole to the position on the interlayer insulating layer can be formed so that the steps of forming the first metal interconnection can be simplified.

Preferably, a space between the bit line (BIT line) and the ground line (GND line) is larger than a space between the bit line and the power supply line ($V_{DD}$ line). Thereby, it is possible to suppress short-circuit between the bit line and the ground line (GND line), and thus a so-called current failure can be suppressed.

The semiconductor memory device according to the invention may be formed on a semiconductor layer, which is formed on a substrate with an insulating layer therebetween. By employing this SOI (Silicon On Insulator) structure, a soft error resistance can be improved. Further, peripheral circuits can operate fast, and a leak current can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described below with reference to FIGS. 1 to 25.

Figure 1:
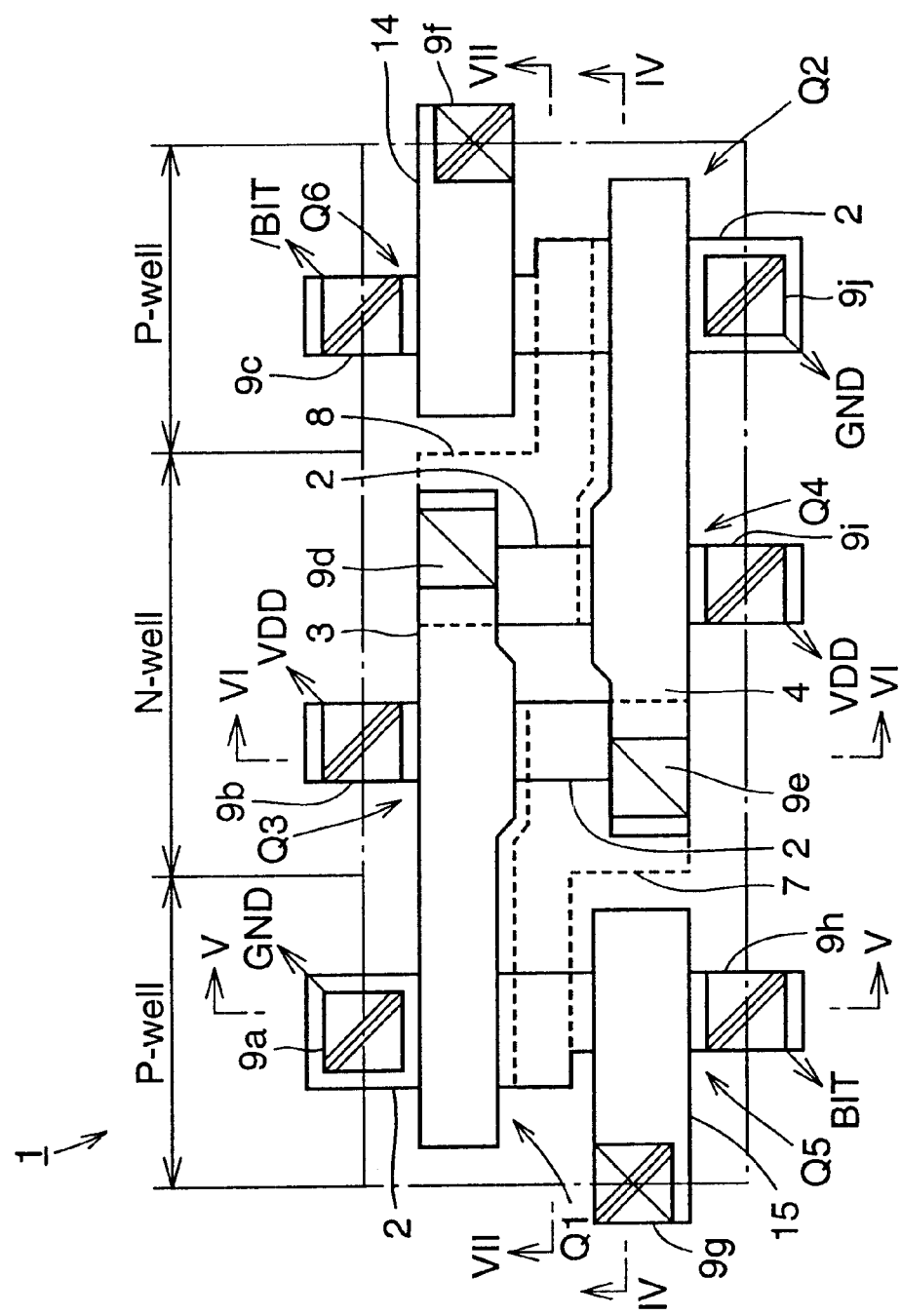
FIG. 1 is a plan showing a layout of gate interconnections in a memory cell of a semiconductor memory device according to the invention.
Figure 2:
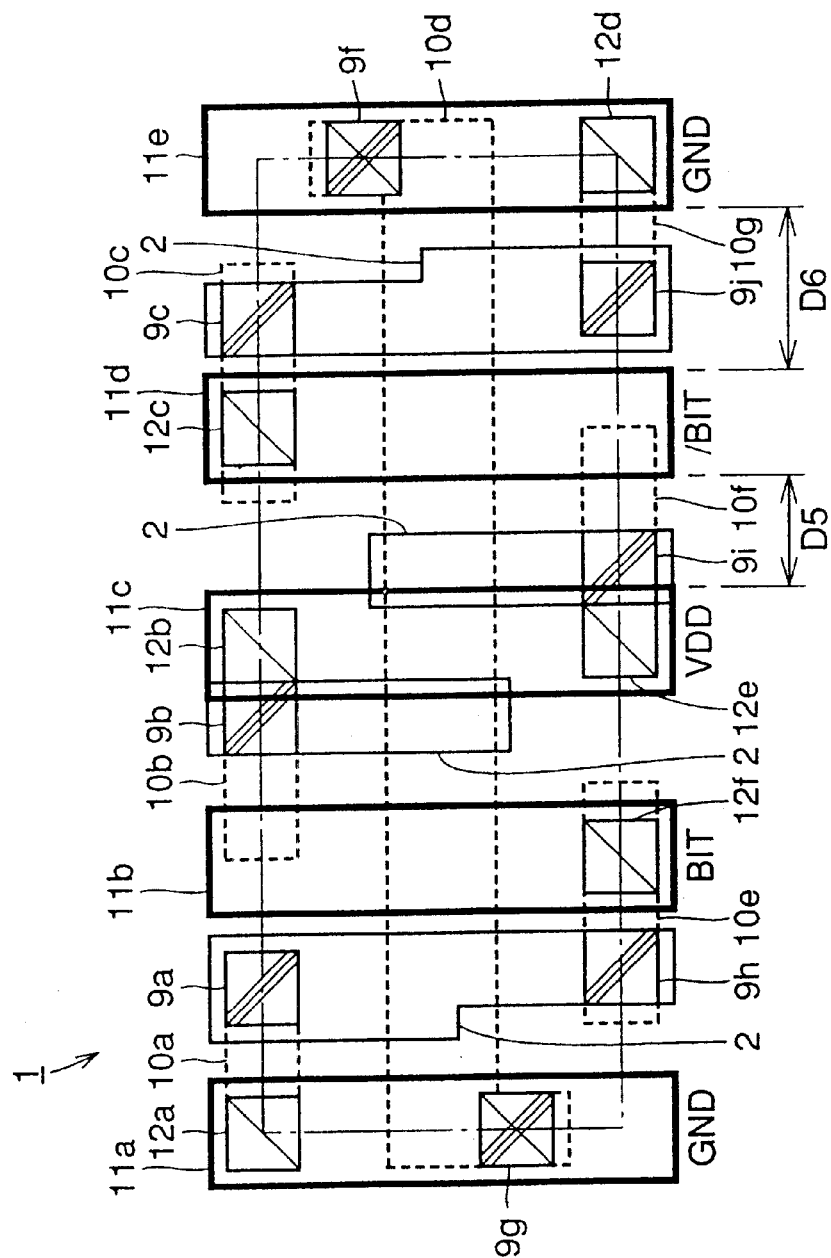
FIG. 2 is a plan showing a layout of upper level metal interconnections of the memory cell of the semiconductor memory device according to the invention.
Figure 3:
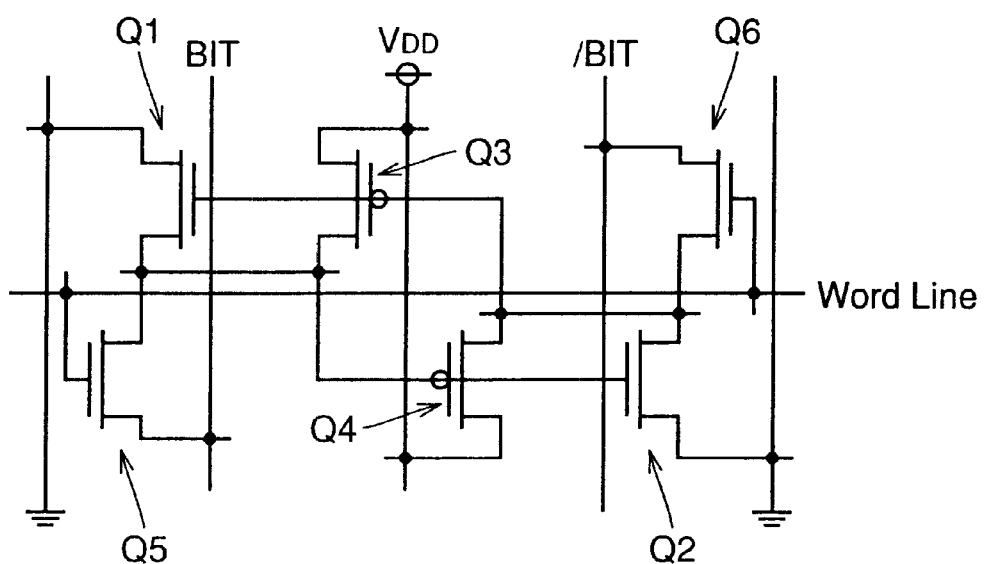
FIG. 3 is an equivalent circuit diagram of the memory cell of the semiconductor memory device according to the invention.

FIGS. 1 and 2 are plans of a memory cell of an SRAM (semiconductor memory device) of an embodiment. FIG. 3 is an equivalent circuit diagram of the SRAM of the embodiment. FIG. 1 shows a layout of lower level interconnections, and FIG. 2 shows a layout of upper level interconnections.

The SRAM includes a memory cell region, in which a memory cell 1 is formed as shown in FIG. 1, and also includes a peripheral circuit region, in which a peripheral circuit for controlling operations of memory cell 1 is formed.

Memory cell 1 has a full CMOS cell structure, and includes first and second inverters and two access MOS transistors.

As shown in FIG. 3, the first inverter includes a first driver MOS transistor Q1 and a first load MOS transistor Q3. The second inverter includes a second driver MOS transistor Q2 and a second load MOS transistor Q4.

The first and second inverters have inputs and outputs connected together to form a flip-flop, which has a first storage node connected to a source of a first access MOS transistor Q5 as well as a second storage node connected to a source of a second access MOS transistor Q6.

As shown in FIG. 1, memory cell 1 has p-, n- and p-well regions arranged in a lateral direction (i.e., an extending direction of a word line). First driver MOS transistor Q1 and first access MOS transistor Q5 are formed on the left p-well region in FIG. 1. First and second load MOS transistors Q3 and Q4 are formed on the middle n-well region. Second driver MOS transistor Q2 and second access MOS transistor Q6 are formed on the right p-well region.

A plurality of active regions 2 each extending in the longitudinal direction are selectively formed in the p- and n-well regions, and first, second and third gates 3, 4, 14 and 15 extend laterally over active regions 2.

Owing to the layout described above, each of active region 2 and gates 3, 4, 14 and 15 can have a nearly straight form as shown in FIG. 1, and therefore the area of memory cell 1 can be reduced.

First gate 3 forms gates of first driver MOS transistor Q1 and first load MOS transistor Q3. Second gate 4 form gates of second driver MOS transistor Q2 and second load MOS transistor Q4. Third gates 14 and 15 form gates of first and second access MOS transistors Q5 and Q6. The gates of first and second access MOS transistors Q5 and Q6 are connected to the word line.

As shown in FIG. 1, memory cell 1 includes first and second local interconnections (storage nodes) 7 and 8. First and second local interconnections 7 and 8 are formed in a self-aligned fashion with respect to first and second gates 3 and 4, and are borderless with respect to active region 2.

First and second local interconnections 7 and 8 are formed within first and second contact holes having forms depicted by broken line in FIG. 1, respectively. First and second contact holes have the substantially same form and size. Accordingly, first and second local interconnections 7 and 8 have the same form and size so that transfer and etching for forming first and second 7 and 8 can be performed easily.

As shown in FIG. 1, the first contact hole, in which first local interconnection 7 is formed, reaches the drains of first load MOS transistor Q3 and first driver MOS transistor Q1, and extends above second gate 4. This contact hole is in communication with a contact hole 9e formed immediately under the same, and reaches second gate 4 through contact hole 9e.

Accordingly, first local interconnection 7 electrically connects second gate 4 to the drain of first load MOS transistor Q3 and the drain of first driver MOS transistor Q1.

The second contact hole, in which second local interconnection 8 is formed, reaches the drain of second load MOS transistor Q4 and the drain of second driver MOS transistor Q2, and extends above first gate 3. This contact hole is in communication with a contact hole 9d formed immediately under the same, and reaches first gate 3 via contact hole 9d.

Therefore, second local interconnection 8 electrically connects first gate 3 to the drain of second load MOS transistor Q4 and the drain of second driver MOS transistor Q2.

Figure 26:
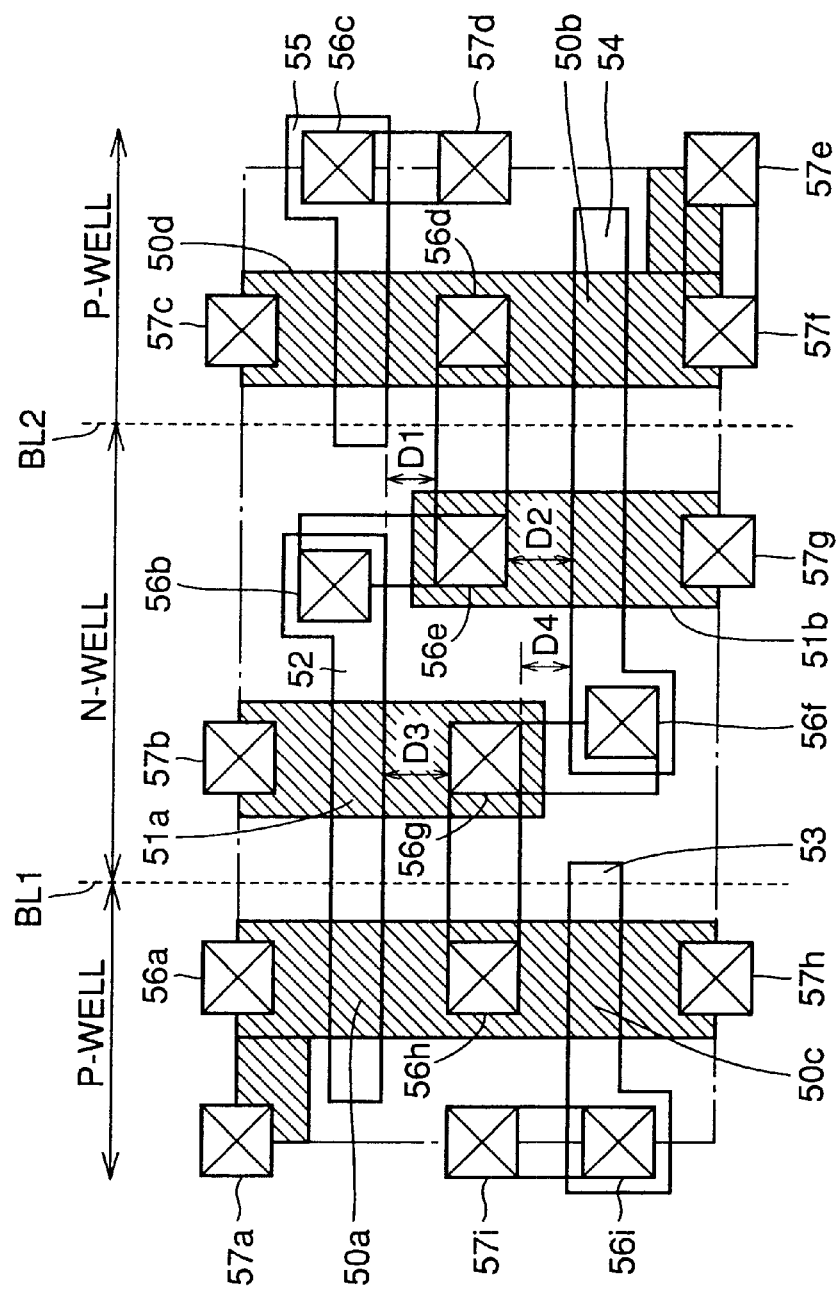
FIG. 26 is a plan showing a layout of a gate interconnection in a memory cell of a semiconductor memory device in the prior art.

As described above, each of the first and second contact holes extends from the position above first or second gate 3 or 4 to the position above the predetermined impurity region. Thereby, it is not necessary to provide independent contact holes 56b, 56e, 56f and 56g, which are spaced from each other, and each are formed in the position on the first or second gate or between the first and second gates, in contrast to the prior art shown in FIG. 26. Thereby, spaces D1 and D4 in FIG. 26 can be reduced.

The first and second contact holes are formed in a self-aligned fashion with respect to first and second gates 3 and 4. Thereby, spaces D2 and D3 in FIG. 26 can be reduced. Accordingly, the space between the first and second gates can be smaller than that in the prior art.

As shown in FIG. 2, first metal interconnections 10a–10g are formed at a higher level than first and second gates 3 and 4, and second metal interconnections 11a–11e are formed at a higher level than first metal interconnections 10a–10g.

First metal interconnection 10a is connected to active region 2 via a contact hole 9a, and is also connected to second metal interconnection (GND line) 11a via a via hole 12a. First metal interconnection 10b is connected to active region 2 via a contact hole 9b, and is also connected to second metal interconnection ($V_{DD}$ line, power supply line) 11c via a via hole 12b.

First metal interconnection 10c is connected to active region 2 via contact hole 9c, and is also connected to second metal interconnection (/BIT line) 11d via a via hole 12c. First metal interconnection 10d is connected to the word line, and is also connected to third gates 14 and 15 via contact holes 9f and 9g.

First metal interconnection 10e is connected to active region 2 via a contact hole 9h, and is connected to second metal interconnection (BIT line) 11b via a contact hole 12f. First metal interconnection 10f is connected to active region 2 via a contact hole 9i, and is also connected to second metal interconnection 11c via a via hole 12e. First metal interconnection 10g is connected to active region 2 via contact hole 9j, and is also connected to second metal interconnection (GND line) 11e via a via hole 12d.

As shown in FIG. 2, a space D6 between second metal interconnections (/BIT line and GND line) 11d and 11e is larger than a space D5 between second metal interconnections (/BIT line and $V_{DD}$ line) 11d and 11c.

Thereby, short-circuit between the BIT line and GND line can be suppressed, and a so-called current failure can be suppressed. For repairing such a current failure, a special redundant circuit or the like is required, resulting in a complicated structure.

On the other hand, the BIT line is usually precharged to a potential of $V_{DD}$ during standby. Therefore, even if the BIT line and the $V_{DD}$ line are short-circuited, the current failure does not occur although an operation failure occur.

The spaces between second metal interconnections 11a–11c are determined similarly to the above. Each of contact holes 9a–9c and 9f–9j is formed in a self-aligned fashion with respect to first or second gate 3 or 4, and is borderless with respect to active region 2.

Figure 4:
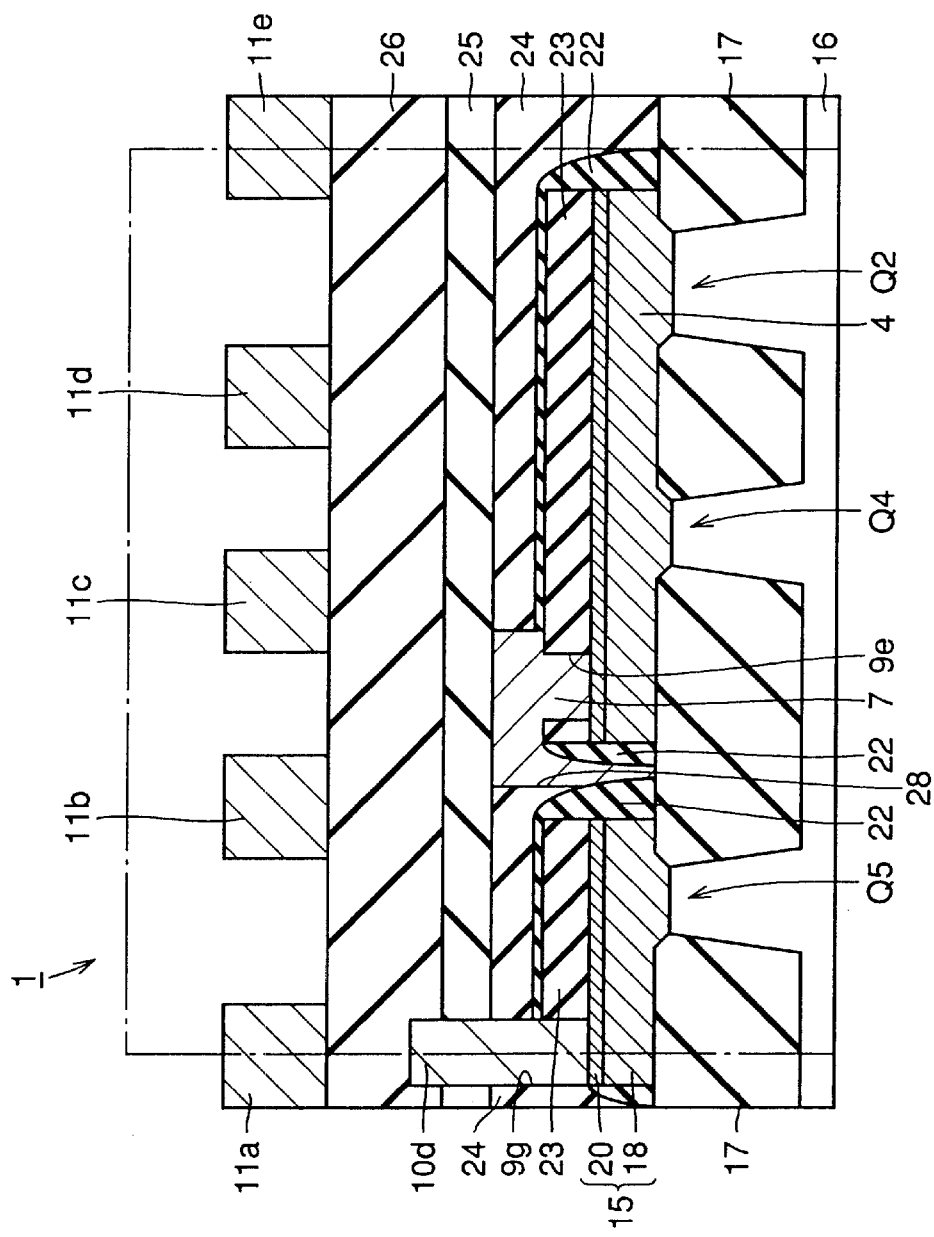
FIGS. 4–7 are cross sections taken along line IV—IV, V—V, VI—VI and VII—VII in FIG. 1, respectively.
Figure 5:
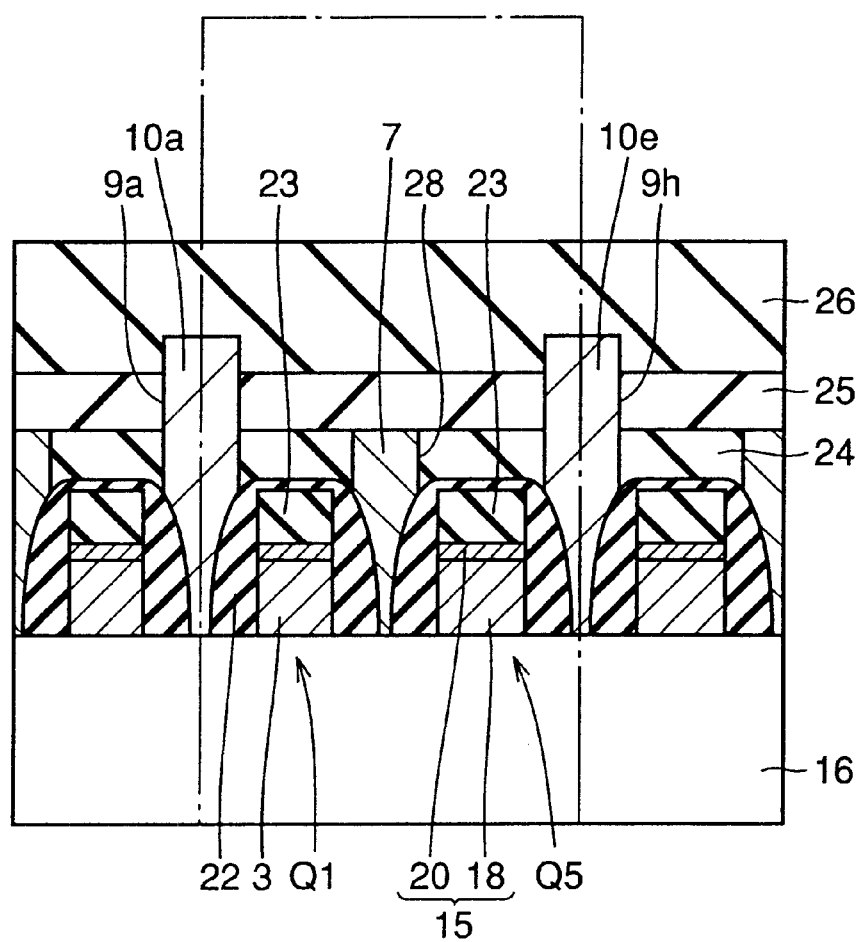
Figure 6:
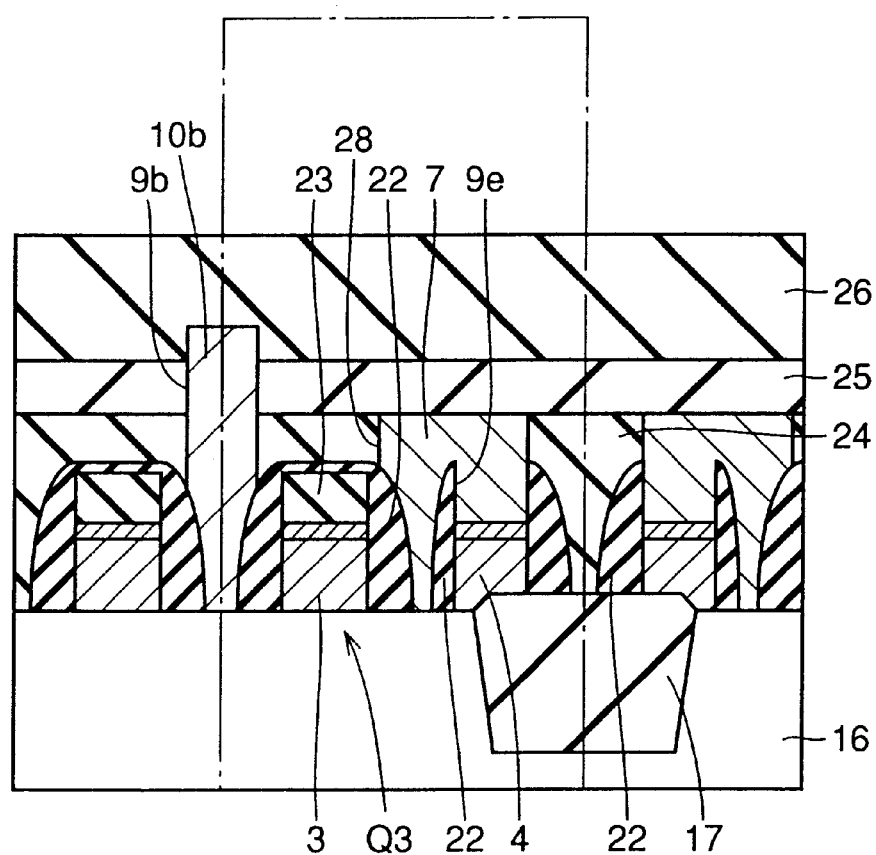
Figure 7:
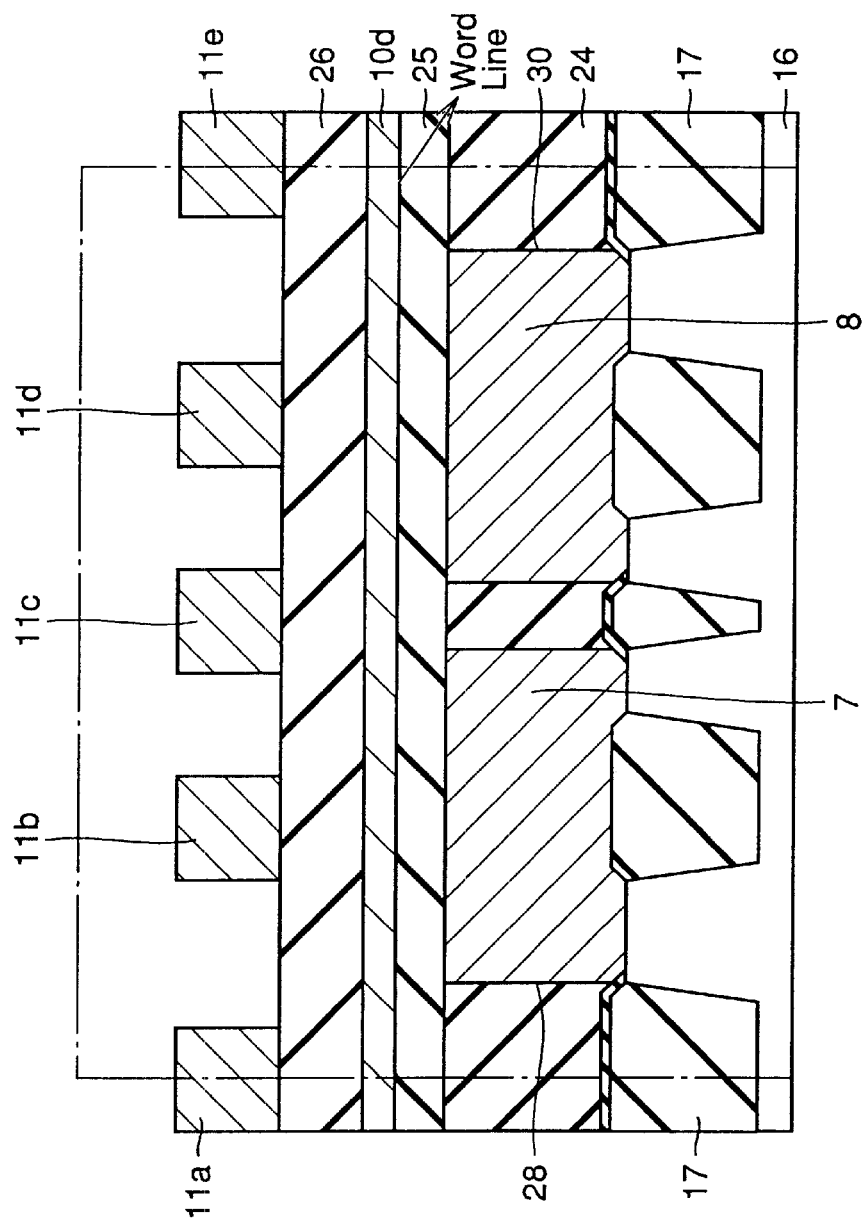

FIGS. 4–7 show sectional structures of memory cell 1 having the foregoing structure. FIG. 4 shows a cross section of memory cell 1 taken along line IV—IV in FIG. 1, and FIG. 5 shows a cross section of memory cell 1 taken along line V—V in FIG. 1. FIG. 6 is a cross section of memory cell 1 taken along line VI—VI in FIG. 1, and FIG. 7 is a cross section of memory cell 1 taken along line VII—VII in FIG. 1.

As shown in FIG. 4, an element isolating and insulating layer 17 is selectively form at the main surface of semiconductor substrate 16 to define the active regions. Second gate 4 is formed on the active region with a gate insulating layer (not shown) therebetween. Second gate 4 has a layered structure including a polycrystalline silicon layer and a tungsten silicide layer 20.

On the predetermined active region, third gate 15 is formed with a gate insulating layer (not shown) therebetween. Third gate 15 has a layered structure including a first polycrystalline silicon layer 18 and tungsten silicide layer 20.

An insulating layer 23 is formed on second and third gates 4 and 15. A side wall insulating layer 22 made of a material such as silicon nitride, which can function as an etching stopper, is formed on side walls of insulating layer 23 and side walls of second and third gates 4 and 15.

An interlayer insulating layer 24 covering sidewall insulating layers 22 and insulating layer 23 is formed, and contact hole 9e extending through insulating layer 23 and a first contact hole 28 extending through interlayer insulating layer 24 are formed. Contact hole 9e is located immediately under first contact hole 28, and forms a portion of first contact hole 28, as already described.

First local interconnection 7 is formed within first contact hole 28. First contact hole 28 reaches sidewall insulating layer 22 on the side wall of third gate 15, and is formed in a self-aligned fashion with respect to third gate 15.

An interlayer insulating layer 25 covering the first and second local interconnections 7 and 8 is formed, and a contact hole 9g extends through interlayer insulating layers 24 and 25 and insulating layer 23. First metal interconnection 10d is formed within contact hole 9g.

First metal interconnection 10d extends continuously from a position within contact hole 9g to a position above interlayer insulating layer 25, and is made of metal such as tungsten. Other first metal interconnections not shown in the figure extend from the corresponding contact holes to the positions above interlayer insulating layer 25, respectively.

First contact hole 28 and contact hole 9g are formed in different steps. Thereby, a sufficiently large space can be ensured between the contact holes as compared with the case of forming these contact holes at the same time.

An interlayer insulating layer 26 covering first metal interconnection 10d is formed, and second metal interconnections 11a–11e are formed on interlayer insulating layer 26. An interlayer insulating layer (not shown) covering second metal interconnections 11a–11e is formed, and via holes (not shown) are formed in this interlayer insulating layer. Further, third metal interconnections (not shown) are formed on the interlayer insulating layer.

As shown in FIG. 5, first contact hole 28 is formed in a self-aligned fashion with respect to first and third gates 3 and 15, and contact hole 9a is formed in a self-aligned fashion with respect to first gate 3. Also, contact hole 9h is formed in a self-aligned fashion with respect to third gate 15.

Thereby, a space between each contact hole and the gate can be reduced, and this can contribute to reduction in memory cell area. The contact holes other than those already described are formed in the self-aligned fashion with respect to the neighboring gates.

As shown in FIG. 6, first contact hole 28 is formed in a self-aligned fashion with respect to first gate 3. This also contributes to reduction in space between first and second gates 3 and 4.

As shown in FIG. 7, first and second local interconnections 7 and 8 are formed in first and second contact holes 28 and 30, respectively, and are covered with interlayer insulating layer 25. First metal interconnection 10d connected to the word line is formed on interlayer insulating layer 25. First metal interconnection 10d extends laterally, and therefore in the longitudinal direction of memory cell 1. Second metal interconnections 11a–11e are formed on first metal interconnection 10d with interlayer insulating layer 26 therebetween.

By employing metal of a low resistance such as aluminum or aluminum alloy as a material of first metal interconnections 10a–10g, first metal interconnections 10a–10g may have smaller thicknesses than second metal interconnections 11a–11e provided that these interconnections have resistance values similar to those in the prior art. Thereby, formation of first metal interconnections 10a–10g, which are usually spaced only by a small distance from each other, can be formed easily, and the yield can be improved.

First metal interconnections 10a–10g may be made of a material different from that of second metal interconnections 11a–11e, and the material of first metal interconnections 10a–10g may be higher than that of the material of second metal interconnections 11a–11e.

As described above, if the required resistance values are similar to those in the prior art, first metal interconnections 10a–10g may be made of tungsten or the like having a relatively high resistivity, and second metal interconnections 11a–11e may be made of aluminum, aluminum alloy or the like having a higher resistivity than tungsten.

Tungsten is a material suitable for filling contact holes. By employing the tungsten as a material of first metal interconnections 10a–10g, first metal interconnections 10a–10g made of tungsten or the like can be extended from the position within the contact holes to the positions above the interlayer insulating layer.

Thereby, it is not necessary to employ a step of form plugs by filling the contact holes with a conductive layer as well as an independent step of forming interconnections of aluminum or aluminum alloy on the plugs. Therefore, the step of forming first metal interconnections 10a–10g can be simplified.

The material of first metal interconnections 10a–10g may be the same as that of the conductive layer filling contact hole 9g and others. In this case, first metal interconnections 10a–10g can be integrally formed within contact hole 9a or the like and on interlayer insulating layer 25. Therefore, the step of forming first metal interconnections 10a–10g can be simple.

On the other hand, second metal interconnections 11a–11e are aligned in the lateral direction, which is the same as the longitudinal direction of memory cell 1, so that the space between the interconnections can be large. Thereby, second metal interconnections 11a–11e can be formed easily, and second metal interconnections 11a–11e can have a large thickness and therefore a low resistance.

Figure 8:
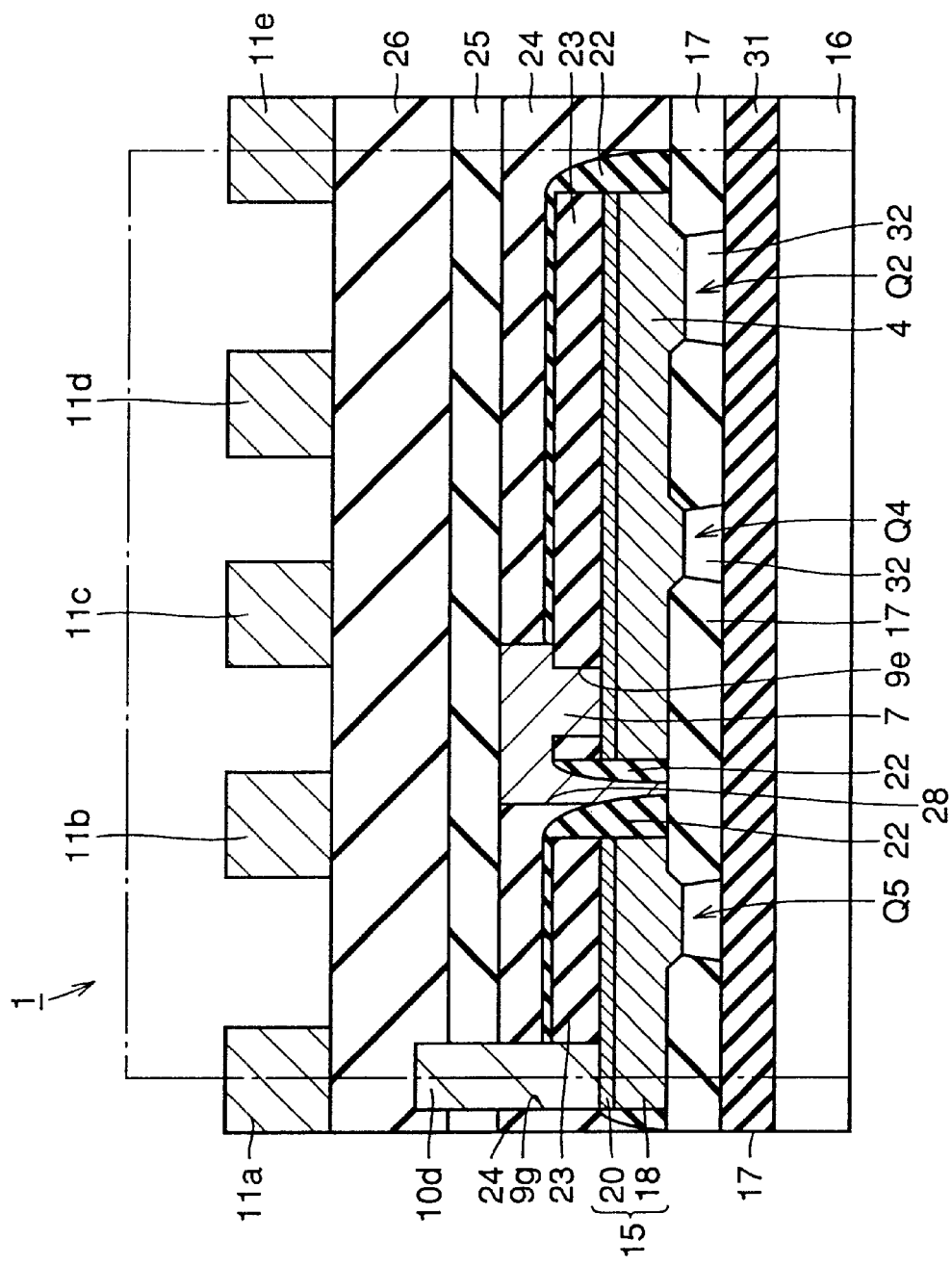
FIG. 8 is a cross section of a memory cell having an SOI structure.

Description has been given on the embodiment, in which the SRAM is formed on semiconductor substrate 16. As shown in FIG. 8, however, the SRAM may be formed on a semiconductor layer 32, which is formed on a substrate 27 with an insulating layer 31 therebetween. By employing such an SOI structure, a soft error resistance can be improved. Further, peripheral circuits can operate fast, and a leak current can be reduced.

Description will now be given on a method of manufacturing memory cells 1 of the SRAM according to the invention with reference to FIGS. 9 to 25.

FIGS. 9–14 show cross sections of memory cell 1 shown in FIGS. 1 and 2, and particularly show the cross sections taken along line IV—IV in different steps, respectively. FIGS. 15–19 show cross sections taken along line V—V in different steps, respectively, and FIGS. 20–25 show cross sections taken along line VI—VI in different steps, respectively.

In the following description, memory cells 1 are formed on the semiconductor substrate. However, the method can be applied to the case of employing the SOI structure. In the figures, an impurity profile in the semiconductor substrate is not shown for simplicity reasons.

Figure 9:
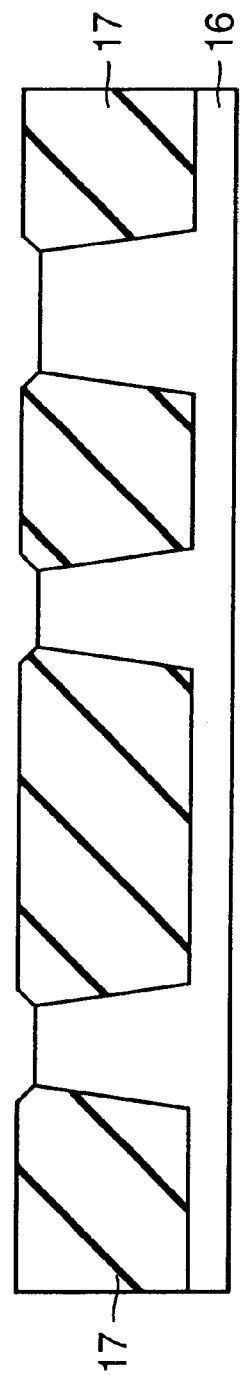
FIGS. 9–14 are cross sections showing first to sixth steps in a process of manufacturing the semiconductor memory device shown in FIG. 1, respectively, and particularly show cross sections corresponding to that in FIG. 4.
Figure 20:
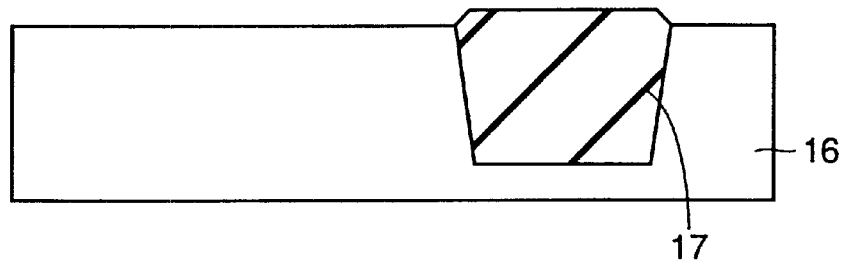
FIGS. 20–25 are cross sections showing first to sixth steps in a process of manufacturing the semiconductor memory device shown in FIG. 1, respectively, and particularly show cross sections corresponding to that in FIG. 6.

As shown in FIGS. 9 and 20, element isolating and insulating layer 17 is selectively formed at a main surface of semiconductor substrate 16 located within the memory cell region. The element isolating and insulating layer 17 can be formed, for example, by selectively and thermally oxidizing the main surface of semiconductor substrate 16. Thereafter, impurities are implanted for forming wells (not shown).

Figure 10:
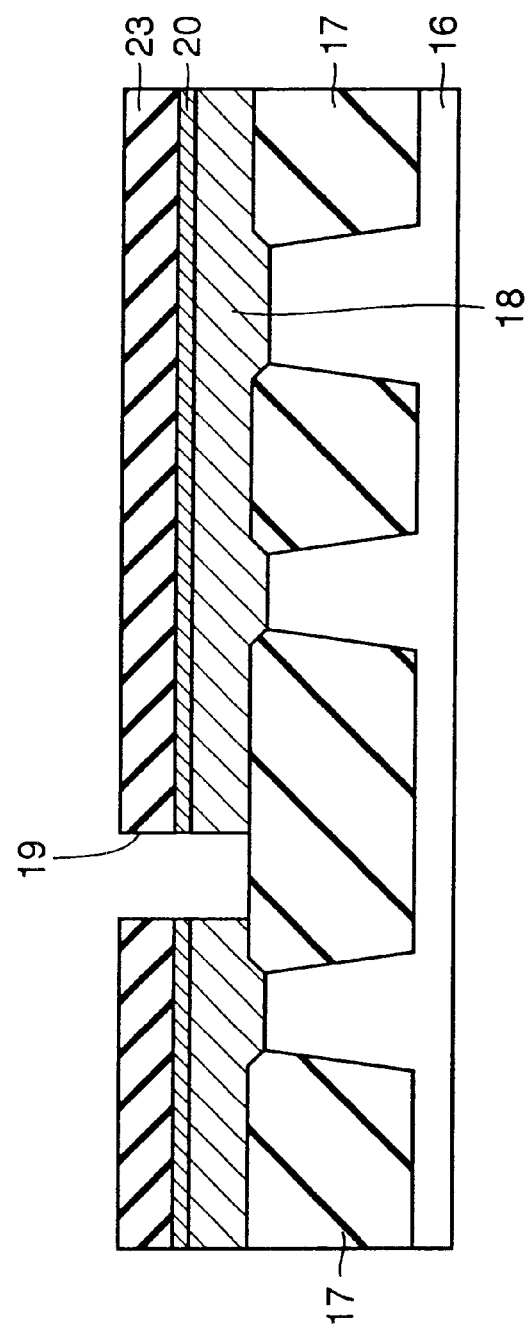
Figure 15:
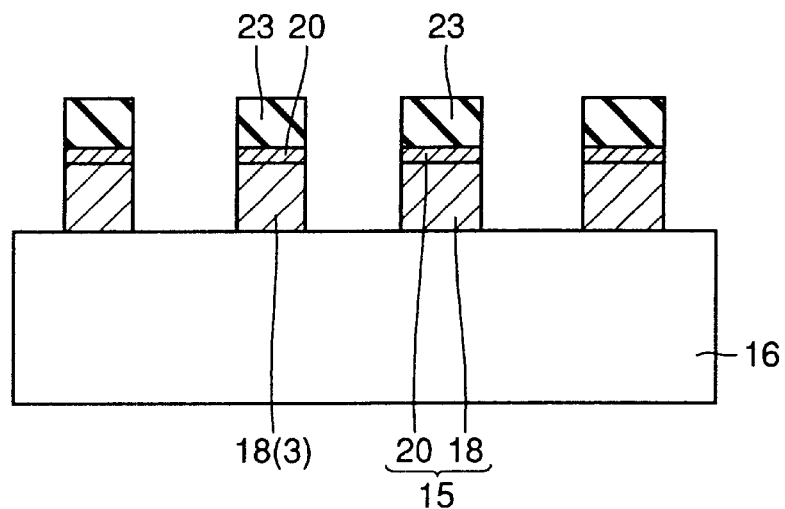
FIGS. 15–19 are cross sections showing second to sixth steps in the process of manufacturing the semiconductor memory device shown in FIG. 1, respectively, and particularly show cross sections corresponding to that in FIG. 5.
Figure 21:
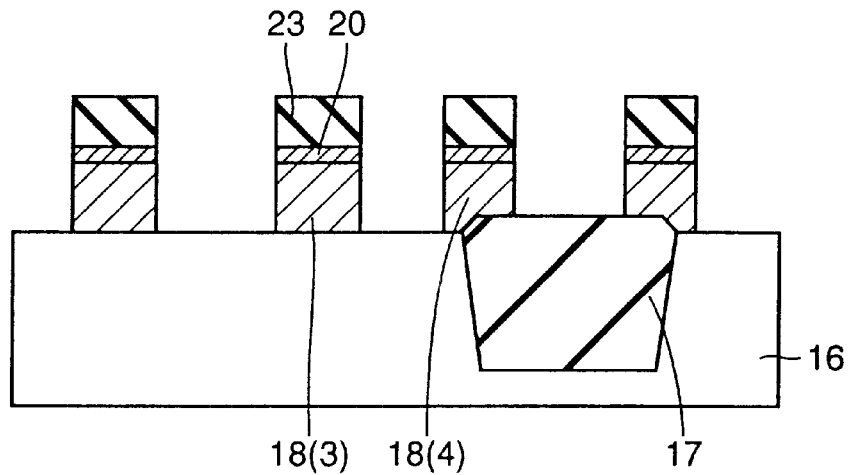

Then, a gate insulating layer (not shown) is formed by a CVD (Chemical Vapor Deposition) method or the like, and then polycrystalline silicon layer 18 is deposited by the CVD method or the like, as shown in FIGS. 10, 15 and 21. For reducing the resistance, it is preferable to dope polycrystalline silicon layer 18 with impurities.

A tungsten layer is formed on polycrystalline silicon layer 18, and then heat treatment or the like is effected to form tungsten silicide layer 20 on polycrystalline silicon layer 18. An insulating layer 23 formed of a silicon oxide layer or the like is formed on tungsten silicide layer 20 by the CVD method or the like.

A mask layer (not shown) is formed on insulating layer 23, and insulating layer 23 thus masked is selectively etched. Using insulating layer 23 as a mask, tungsten silicide layer 20 and polycrystalline silicon layer 18 are etched, as shown in FIGS. 10, 15 and 21. Thereby, first and second gates 3 and 4 as well as third gates (gates of access MOS transistors Q5 and Q6) 14 and 15 are formed.

Figure 11:
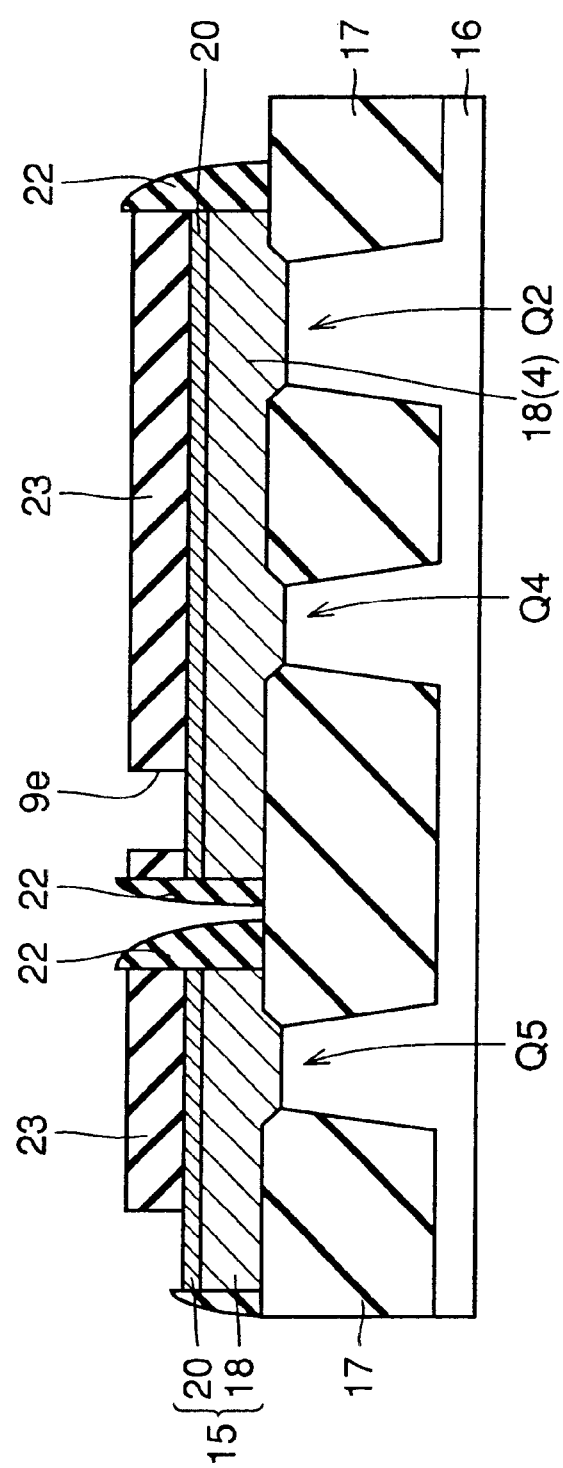
Figure 16:
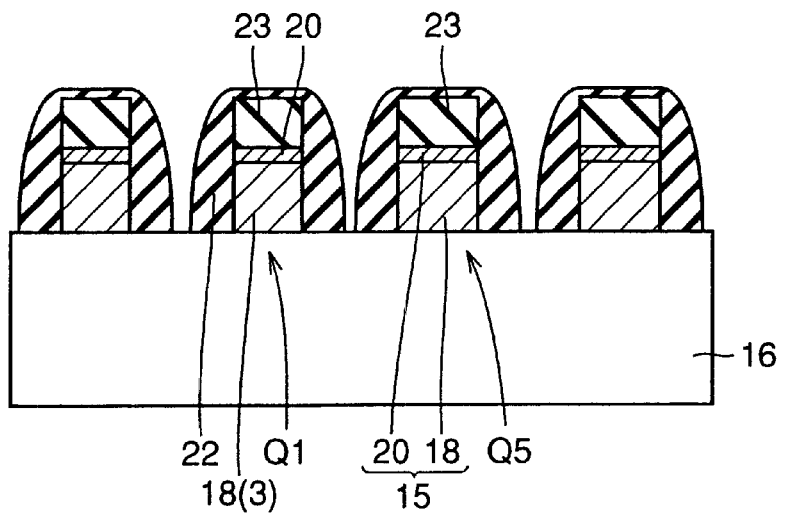
Figure 22:
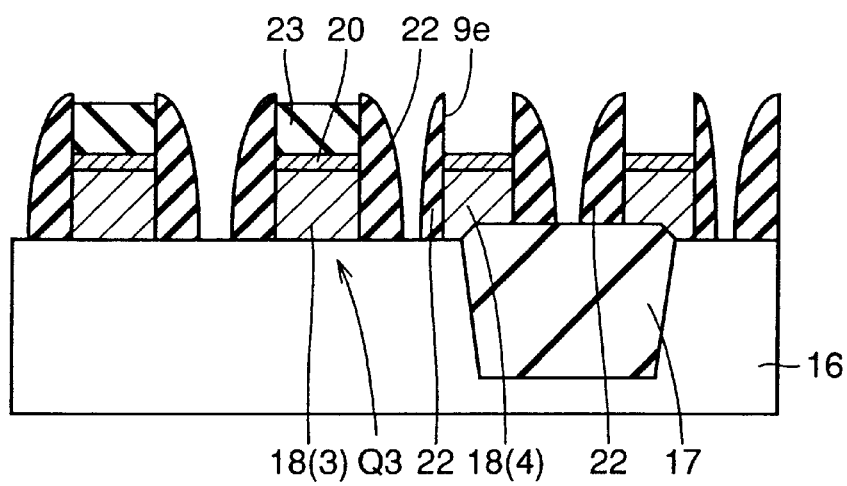

Then, processing such as impurity implantation for forming the MOS transistors and formation of sidewall insulating layer 22 are performed as shown in FIGS. 11, 16 and 22. In connection with this, a material such as silicon nitride, which can function as an etching stopper during etching of the silicon oxide layer, is employed as the material of sidewall insulating layer 22. Thereafter, insulating layer 23 is selectively etched to form opening 9e.

Then, an etching stopper layer such as a silicon nitride layer is deposited on the whole surface, and interlayer insulating layer 24 made of silicon oxide or the like is deposited on the etching stopper layer. After flattening interlayer insulating layer 24, a mask (not shown) for forming local interconnections is formed on interlayer insulating layer 24, and interlayer insulating layer 24 thus masked is selectively etched.

Figure 12:
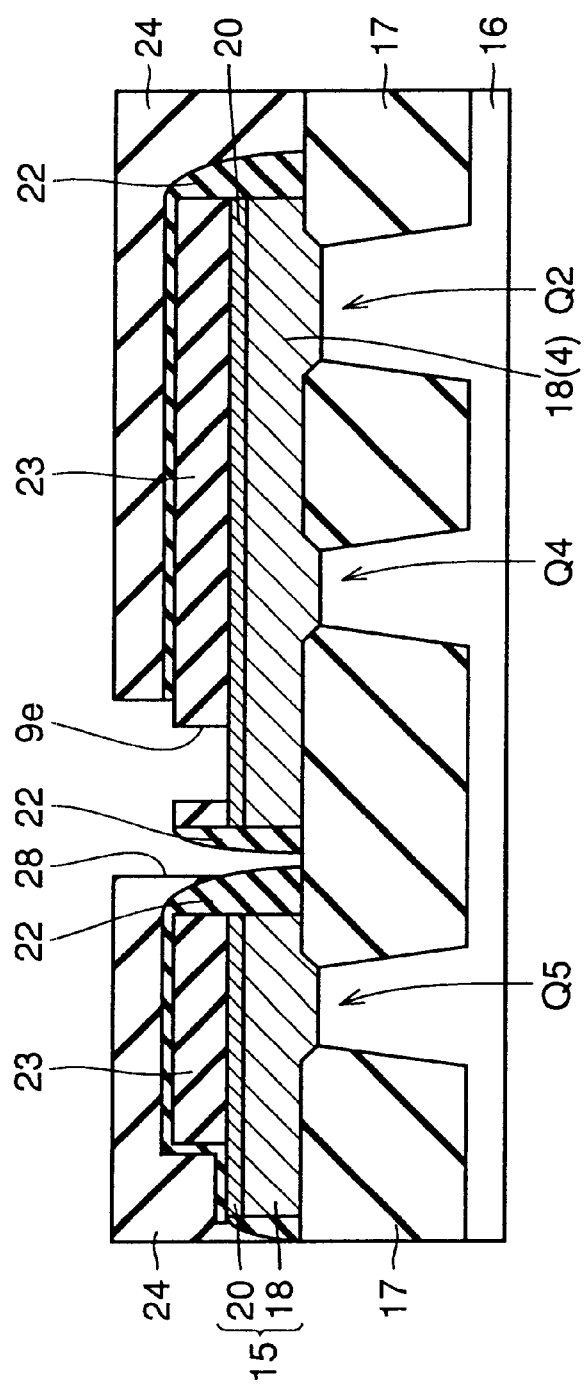
Figure 17:
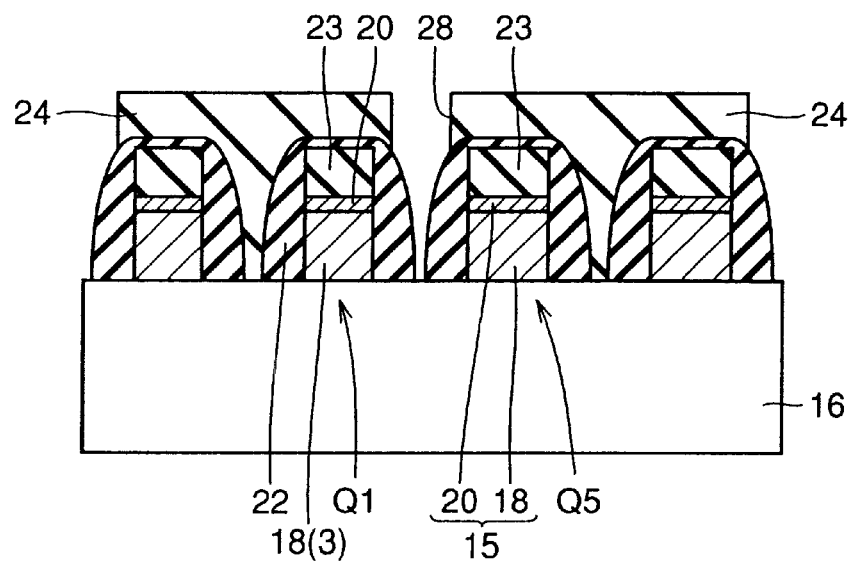
Figure 23:
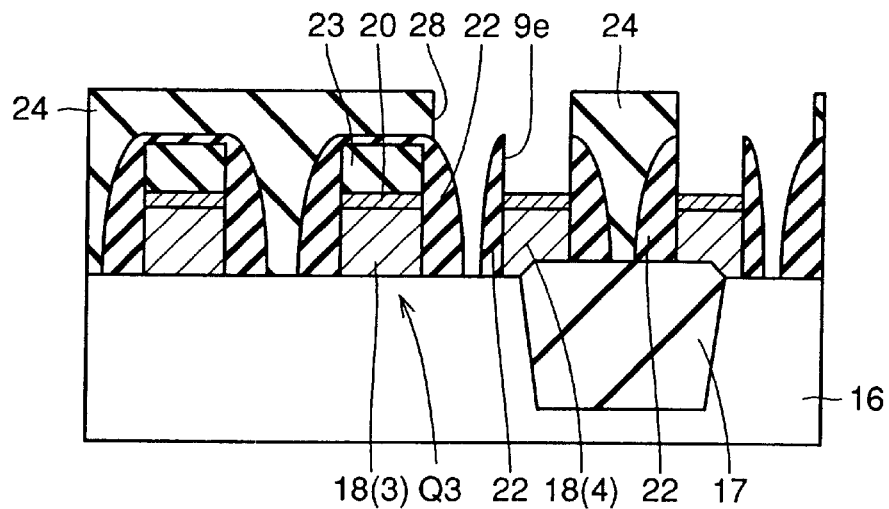

The etching is stopped by the etching stopper layer, and the etching stopper layer is removed from portions where interlayer insulating layer 24 is removed. Thereby, first contact hole 28, which has a self-aligned structure, and is in communication with contact hole 9e, is formed as shown in FIGS. 12, 17 and 23.

Figure 13:
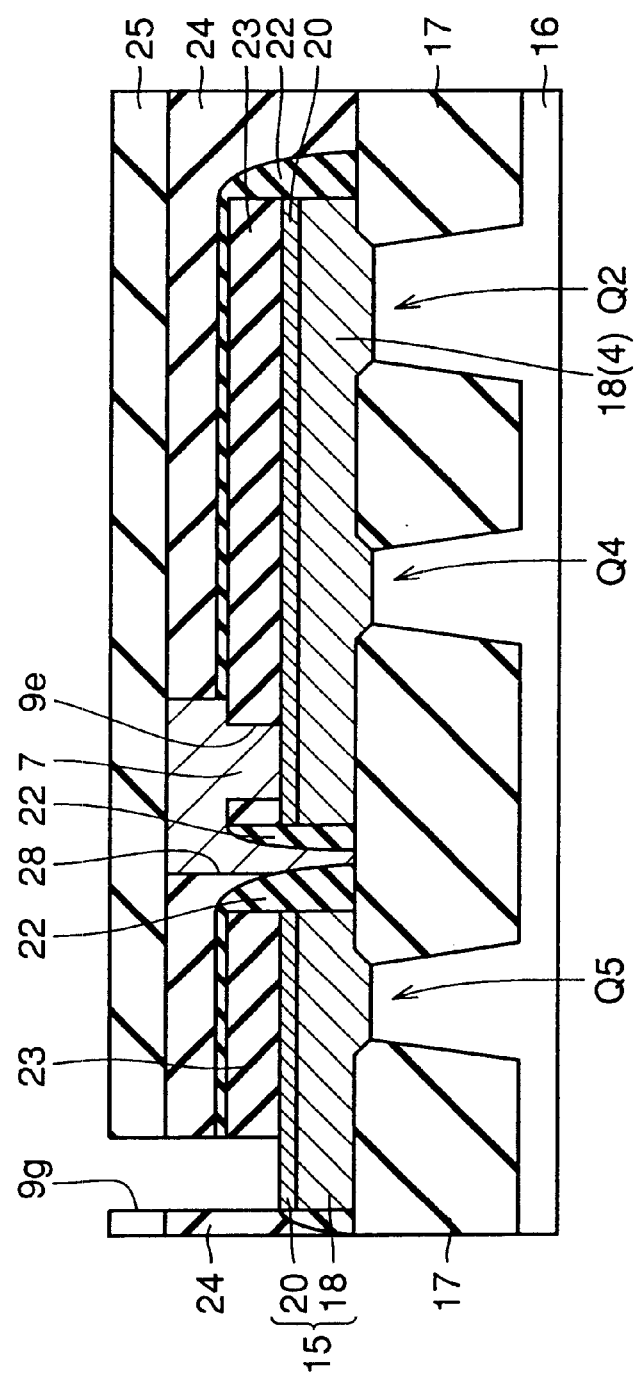
Figure 18:
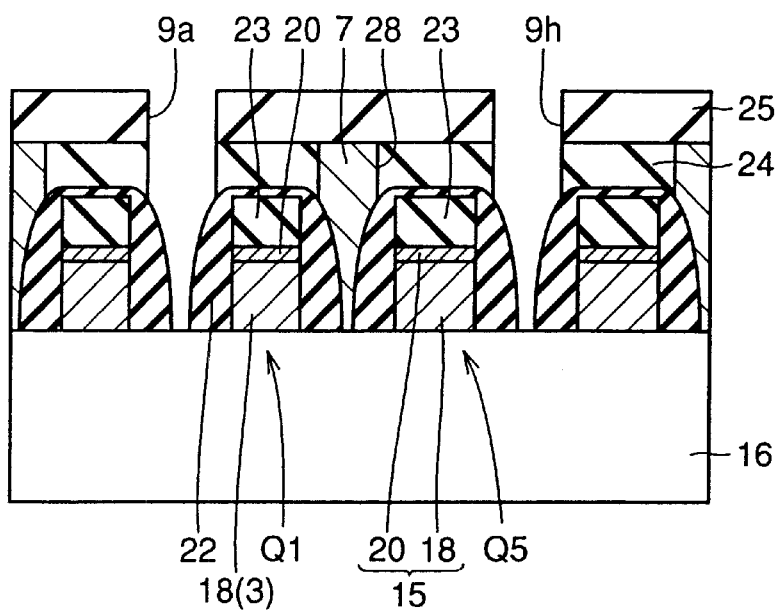
Figure 24:
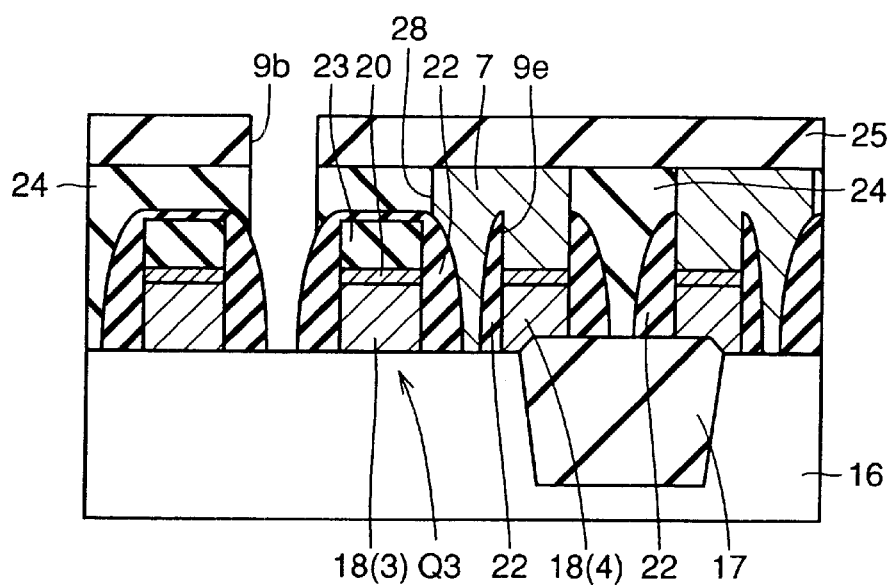

Then, the CVD method or the like is performed to deposit a tungsten layer covering interlayer insulating layer 24, and the surface of the tungsten layer is flattened. Thereby, contact hole 9e and first contact hole 28 can be filled with the tungsten layer so that first local interconnection 7 can be formed as shown in FIGS. 13, 18 and 24. In this operation, second local interconnection 8 (not shown) is formed at the same time.

Thereafter, interlayer insulating layer 25 formed of a silicon oxide layer or the like is deposited on interlayer insulating layer 24, and flattening processing is effected on interlayer insulating layer 25. A mask layer (not shown) is formed on interlayer insulating layer 25, and interlayer insulating layers 24 and 25 are selectively etched with this mask layer. Additionally, the etching is selectively effected on the etching stopper layer and insulating layer 23 located on third gates 14 and 15.

Thereby, contact holes 9a–9c and 9f–9j of the self-aligned structure are formed, as shown in FIGS. 13, 18 and 24.

Figure 14:
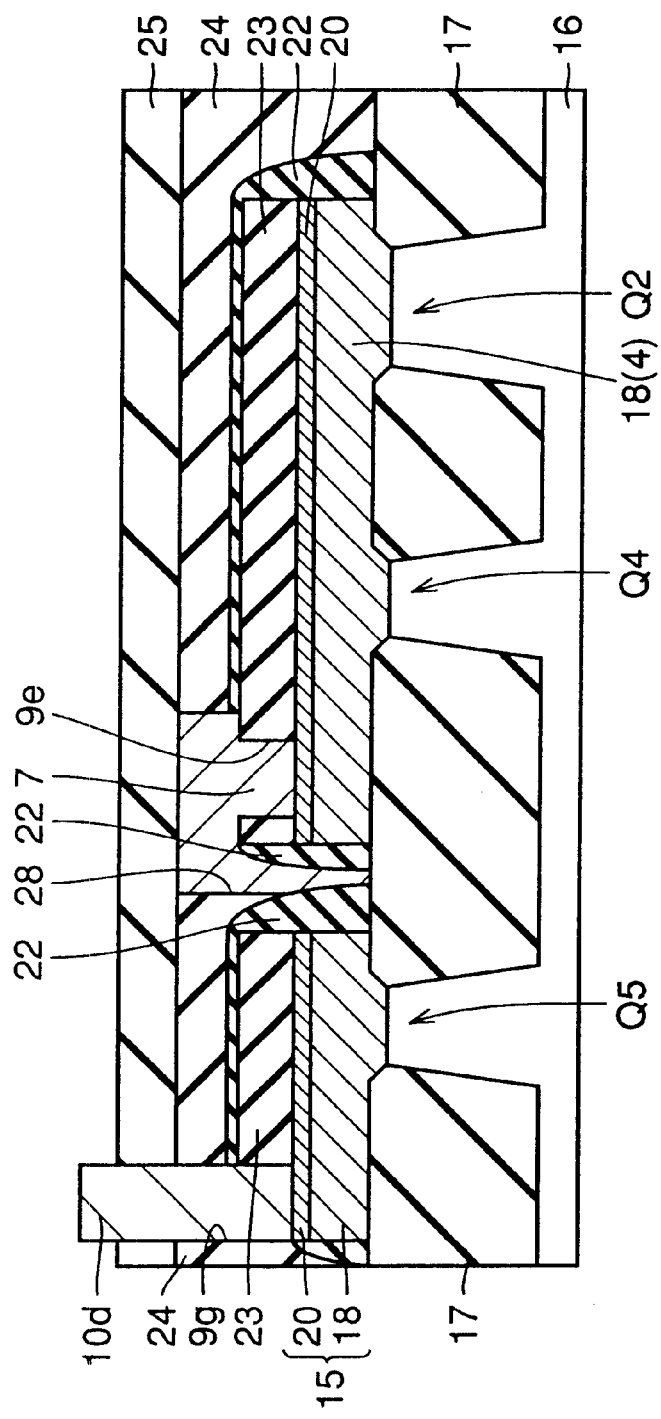
Figure 19:
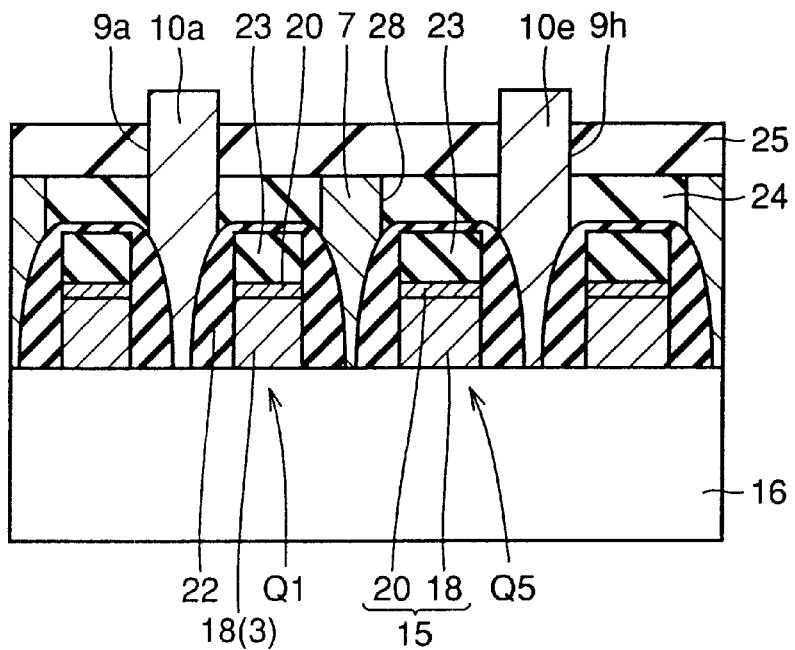
Figure 25:
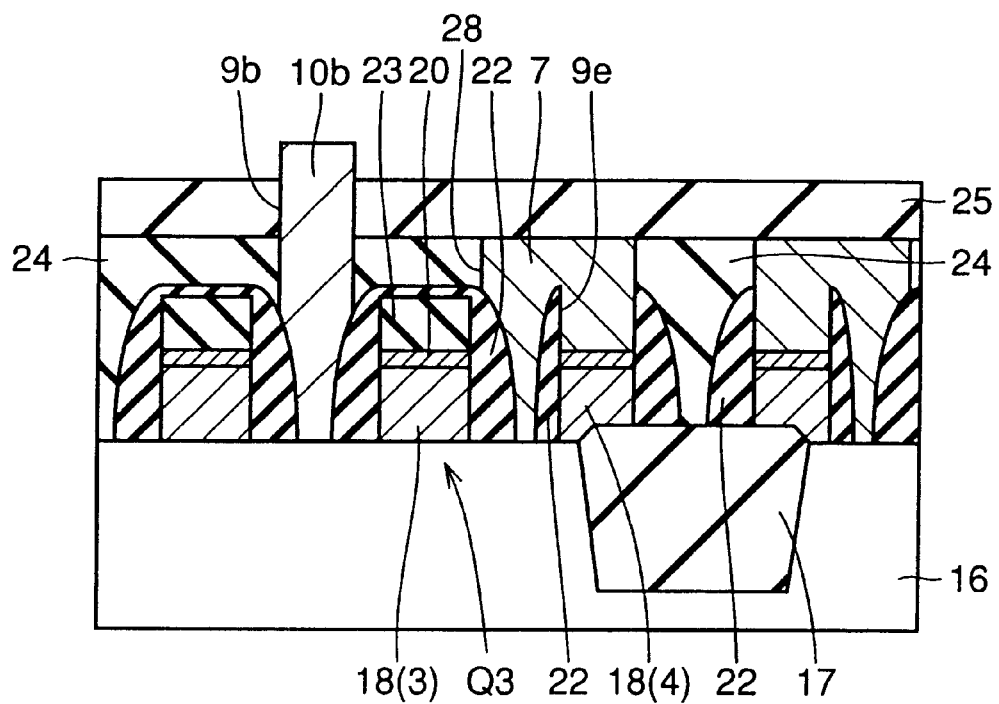

Thereafter, a tungsten layer covering interlayer insulating layer 25 is deposited by the CVD method or the like, and then is patterned. Thereby, contact holes 9a–9c and 9f–9j are filled with the tungsten layer, and first metal interconnections 10a–10g extending from positions within contact holes 9a–9c and 9f–9j to positions above interlayer insulating layer 25 are formed, as shown in FIGS. 14, 19 and 25.

Thereafter, an interlayer insulating layer 26 covering first metal interconnections 10a–10g is formed. Via holes 12a–12f are formed in interlayer insulating layer 26, and are filled with a tungsten layer. A metal layer is formed on interlayer insulating layer 26, and then is patterned to form second metal interconnections 11a–11e.

Through the foregoing steps, the memory cells of the SRAM shown in FIGS. 4–6 are formed. Thereafter, an interlayer insulating layer (not shown) is formed on second metal interconnections 11a–11e, and third metal interconnections are formed on this interlayer insulating layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

memory cells each including first and second access MOS (Metal Oxide Semiconductor) transistors, first and second driver MOS transistors, and first and second load MOS transistors;

a first well region of a first conductivity type for forming said first driver MOS transistor and said first access MOS transistor thereon;

a second well region of the first conductivity type for forming said second driver MOS transistor and said second access MOS transistor thereon;

a third well region of a second conductivity type formed between said first and second well regions for forming said first and second load MOS transistors thereon;

a first gate forming gates of said first driver MOS transistor and said first load MOS transistor;

a second gate for forming gates of said second driver MOS transistor and said second load MOS transistor;

a first contact hole formed in a self-aligned manner with respect to said first and second gates, and reaching one of impurity regions of said first driver MOS transistor, one of impurity regions of said first load MOS transistor and said second gate;

a first local interconnection formed in said first contact hole, and electrically connected to said first driver MOS transistor, said first load MOS transistor and said second gate;

a second contact hole formed in a self-aligned manner with respect to said first and second gates, and reaching one of impurity regions of said second driver MOS transistor, one of impurity regions of said second load MOS transistor and said first gate; and a second local interconnection formed in said second contact hole, and electrically connecting said second driver MOS transistor, said second load MOS transistor and said first gate.

2. The semiconductor memory device according to claim 1, wherein
said first and second contact holes have the same form.

3. The semiconductor memory device according to claim 1, further comprising:

a first interlayer insulating layer covering said first and second gates;

a second interlayer insulating layer formed on said first interlayer insulating layer;

a first metal interconnection formed on said second interlayer insulating layer, extending in a direction of alignment of said first, second and third well regions, and forming a word line; and a plurality of second metal interconnections formed on said first metal interconnection with a third interlayer insulating layer therebetween, and forming a bit line, a ground line and a power supply line.

4. The semiconductor memory device according to claim 3, further comprising:
a plurality of third contact holes for electrically connecting said second metal interconnections to the predetermined MOS transistors, wherein
said first and second contact holes are formed in said first interlayer insulating layer, and
said third contact holes extend through said first and second interlayer insulating layers, and are formed in a self-aligned manner with respect to said first or second gate.

5. The semiconductor memory device according to claim 3, wherein
said first metal interconnection has a smaller thickness than said second metal interconnection.

6. The semiconductor memory device according to claim 3, wherein
said first and second metal interconnections are made of different materials, respectively, and
the material of said first metal interconnection has a higher resistivity than the material of said second metal interconnection.

7. The semiconductor memory device according to claim 4, wherein
said first metal interconnection is made of the same material as a conductive layer filling said third contact hole.

8. The semiconductor memory device according to claim 3, wherein
a space between said bit line and said ground line is larger than a space between said bit line and said power supply line.

9. The semiconductor memory device according to claim 1, wherein
said semiconductor memory device is formed on a semiconductor layer formed on a substrate with an insulating layer therebetween.

* * * * *